United States Patent
DeYoung et al.

(10) Patent No.: US 6,953,041 B2
(45) Date of Patent: Oct. 11, 2005

(54) COMPOSITIONS OF TRANSITION METAL SPECIES IN DENSE PHASE CARBON DIOXIDE AND METHODS OF USE THEREOF

(75) Inventors: James P. DeYoung, Durham, NC (US); James B. McClain, Raleigh, NC (US); Stephen M. Gross, Chapel Hill, NC (US); Mark I. Wagner, Raleigh, NC (US)

(73) Assignee: MiCell Technologies, Inc., Raleigh, NC (US)

( * ) Notice: Subject to any disclaimer, the term of this patent is extended or adjusted under 35 U.S.C. 154(b) by 220 days.

(21) Appl. No.: 10/267,276

(22) Filed: Oct. 9, 2002

(65) Prior Publication Data

US 2004/0071873 A1 Apr. 15, 2004

(51) Int. Cl.⁷ .............. B08B 6/00; C25F 1/00
(52) U.S. Cl. .............. 134/1.1; 134/1.2; 134/1.3; 438/723; 438/724; 438/785
(58) Field of Search .............. 134/1.1–1.3; 438/723, 438/724, 758, 765, 785, 764

(56) References Cited

U.S. PATENT DOCUMENTS

| | | |
|---|---|---|
| 3,649,194 A | 3/1972 | Glanville |
| 4,014,715 A | 3/1977 | Preston |
| 4,028,281 A | 6/1977 | Millard et al. |
| 4,325,744 A | 4/1982 | Panayappan et al. |
| 4,581,102 A | 4/1986 | Brock |
| 4,675,125 A | 6/1987 | Sturwold |
| 5,266,205 A | 11/1993 | Fulton et al. |
| 5,272,151 A | 12/1993 | Marzi et al. |
| 5,279,677 A | 1/1994 | Das |
| 5,676,705 A | 10/1997 | Jureller et al. |
| 5,683,473 A | 11/1997 | Jureller et al. |
| 5,683,977 A | 11/1997 | Jureller et al. |
| 5,783,082 A | 7/1998 | DeSimone et al. |
| 5,789,027 A | 8/1998 | Watkins et al. |
| 5,868,856 A | 2/1999 | Douglas et al. |
| 5,868,862 A | 2/1999 | Douglas et al. |
| 5,908,510 A | 6/1999 | McCullough et al. |
| 5,920,790 A * | 7/1999 | Wetzel et al. ............... 438/618 |
| 5,976,264 A | 11/1999 | McCullough et al. |
| 6,176,895 B1 | 1/2001 | DeSimone et al. |
| 6,218,353 B1 | 4/2001 | Romack et al. |
| 6,277,753 B1 | 8/2001 | Mullee et al. |
| 6,343,609 B1 * | 2/2002 | Kim ..................... 134/1.3 |
| 2003/0116176 A1 * | 6/2003 | Rothman et al. ......... 134/1.3 |
| 2003/0188763 A1 * | 10/2003 | Banerjee et al. ......... 134/1.2 |

FOREIGN PATENT DOCUMENTS

WO  WO 96/27704  9/1996

OTHER PUBLICATIONS

International Search Report for PCT/US03/30702; Date of Mailing Dec. 1, 2004.
DeSimone, J., *Practical Approaches to Green Solvents*, Science, vol. 297, pp. 799 (Aug. 2, 2002).
Sarbu, T., et al., *Non–fluorous polymers with very high solubility in supercritical $CO_2$ down to low pressures*, Nature, vol. 405, pp. 165 (May 11, 2000).
Wang, C.W., et al., *Supercritical $CO_2$ Fluid for Chip Resistor Cleaning*, Journal of the Electrochemical Society, vol. 146, pp. 3485 (1999).

* cited by examiner

Primary Examiner—Duy-Vu N. Deo
(74) Attorney, Agent, or Firm—Myers Bigel Sibley & Sajovec

(57) ABSTRACT

Compositions useful for cleaning metal from a substrate or coating metal onto a substrate are described: Such compositions comprise (a) a densified carbon dioxide continuous phase; (b) a polar discrete phase in said carbon dioxide continuous phase; (c) a metal in said discrete phase (i.e., a metal removed from the substrate, or to be coated onto the substrate); (d) at least one ligand in said continuous phase, said discrete phase, or both said continuous and said discrete phase.

48 Claims, No Drawings

United States Patent US 6,953,041 B2

COMPOSITIONS OF TRANSITION METAL SPECIES IN DENSE PHASE CARBON DIOXIDE AND METHODS OF USE THEREOF

FIELD OF THE INVENTION

The present invention concerns methods of cleaning metal from substrates, as well as coating substrates with metals.

BACKGROUND OF THE INVENTION

Carbon dioxide is an environmentally friendly solvent that is desirable for use in a variety of industrial applications. See generally J. DeSimone, *Practical Approaches to Green Solvents*, Science 297, 799 (Aug. 2, 2002). However, many industrial applications involve the handling of metals in solutions. There is a need for new systems to better enable the use of carbon dioxide for handling metals, both for cleaning metals from substrates and for depositing metals on substrates (e.g., plating).

The following references are noted herein: C. W. Wang et al., *Supercritical $CO_2$ Fluid for Chip Resistor Cleaning*, Journal of the Electrochemical Society 146, 3485 (1999); U.S. Pat. Nos. 6,176,895, 5,789,027, 5,783,082, 5,868,56, 5,868,862, 5,908,510, 5,976,264, and 6,277,753.

SUMMARY OF THE INVENTION

A first aspect of the present invention is a composition comprising:

(a) a densified carbon dioxide continuous phase;
(b) a polar discrete phase (e.g., an aqueous discrete phase) in the carbon dioxide continuous phase (e.g., homogeneously distributed therein);
(c) a metal ion in the discrete phase; and
(d) at least one ligand in the continuous phase, the discrete phase, or both the continuous and the discrete phase.

The ligand may be soluble in the carbon dioxide continuous phase, may be soluble in the discrete phase, or soluble in both. The composition may further comprise a surfactant, or the ligand itself may be a surfactant. The composition may be in any suitable form, such as a suspension, dispersion, emulsion or microemulsion. The composition may further comprise an oxidation agent (e.g., a peroxide) in either or both the continuous or discrete phase, such as an organic or mineral acid oxidizing agent. The oxidizing agent may be a gas at atmospheric conditions. The composition may further comprise a reducing agent (e.g., a hydridic salt reducing agent, a Lewis base complex with borane as a reducing agent, a transition metal complex reducing agent) in either or both of the continuous or discrete phases, which reducing agent may be a gas at atmospheric conditions. The composition may further comprise a stabilizing agent (e.g., a surfactant) in either or both of the continuous or discrete phases. Surfactants included in the composition may be $CO_2$-philic surfactants, surfactants that are philic to the discrete phase (e.g., hydrophilic surfactants), or combinations thereof. Stabilizing agents that may be included in the composition include those which may serve as nano-phase transfer agents. The composition may include a second ligand, which second ligand may be preferentially soluble in the continuous phase or the discrete phase. Compositions as so described may be used in cleaning metals from a substrate (in which case the metal is added to the composition from the substrate and the composition prior to contacting to the substrate does not contain said metal), or may be used in depositing metals on a substrate (e.g., plating), as described in further detail below.

A further aspect of the invention is a method of cleaning metal from a substrate, comprising the steps of:

(a) providing a substrate having a surface portion to be cleaned of metal;
(b) providing a densified carbon dioxide cleaning composition, the composition comprising carbon dioxide as a continuous phase, a discrete polar phase, and at least one ligand solubilized in the discrete phase, the continuous phase or both the discrete phase and the continuous phase;
(c) immersing the surface portion in the densified carbon dioxide cleaning composition so that the metal associates with the ligand; and then
(d) removing the cleaning composition from the surface portion so that the metal is thereby cleaned from the surface portion.

The cleaning composition may include any of the features described above and may be in any form as described above. In one example embodiment of the method, the step of providing a substrate having a surface portion to be cleaned is carried out by: (i) providing a semiconductor substrate having a barrier formed thereon, and (ii) etching through the barrier to thereby produce a semiconductor to be cleaned. In another example embodiment of the method, the step of providing a substrate having a surface portion to be cleaned is carried out by: (i) providing a semiconductor substrate having a surface portion to be planarized, and then (ii) planarizing the surface portion by chemical mechanical planarization to thereby provide a semiconductor to be cleaned. In yet another example embodiment of the method, the step of providing a substrate having a surface portion to be cleaned is carried out by: (i) providing a low k dielectric semiconductor substrate to be etched, and (ii) etching the semiconductor to thereby provide a semiconductor to be cleaned. As above, the ligand may be soluble in the carbon dioxide continuous phase, or in the discrete phase, or the composition may include a plurality of ligands, with at least one ligand preferentially soluble in each phase. In addition to semiconductor substrates, the substrate may be a photolithographic imaging lens or a mask. The metal to be cleaned may be in any form, such as particles, etch residues, etc. The metal to be cleaned may be copper, including copper in an oxidation state of (0), (I), or (II). The discrete polar phase may include a surfactant as noted above, and in some embodiments the surfactant may coordinate with the metal.

A further aspect of the present invention is a method of coating a metal onto a substrate, comprising the steps of:

(a) providing a substrate having a surface portion to be coated with a metal;
(b) providing a densified carbon dioxide composition, the composition comprising carbon dioxide as a continuous phase, a polar discrete phase, a metallic species and at least one ligand dissolved in the discrete phase, the continuous phase, or both the discrete phase and the continuous phase;
(c) immersing the surface portion in the carbon dioxide composition;
(d) adding a reducing agent to the carbon dioxide composition so that the metallic species is chemically reduced, separates from the ligand and deposits on the surface portion; and then (e) removing the carbon dioxide composition from the surface portion to leave metal deposited on the surface portion.

The carbon dioxide composition may included any of the components or ingredients described above, and may be in any form as described above. The surface portion may be metallic, may be a silicon dioxide surface portion, may be portion is porous (e.g., have pore sizes of between 2 and 100 nm formed therein), may have both a metallic portion and a silicon dioxide-based surface portion, etc. In some embodiments, the reduced metal species is preferentially deposited onto the metallic surface. The metal layer may serve as a seed layer for subsequent substrate metallization, the metal layer may serve as a barrier layer (e.g., preventing atomic migration of species into or through low k dielectric layers contained in the semiconductor-based substrate), the metal layer may serve as a conductor, etc. The metal may be deposited in any suitable form, such as a uniform consistent film (e.g., a thin film, for example from 0.001, 0.01 or 0.1 to 10, 100 or 200 nm in thickness), as a particulate (e.g., from 1 or 5 to 100 or 200 nm in size), etc.

The present invention is explained in greater detail in the specification set forth below.

DETAILED DESCRIPTION OF THE PREFERRED EMBODIMENTS

The invention provides a process for the formation of coordinated transition metal species in dense phase carbon dioxide using inverse w/$CO_2$ microemulsions as transformation and transport vehicles for metal oxidation and/or metal ion dissociation followed by metal coordination with suitable ligands and optionally chemical reduction. Once the metal ion or species is coordinated and contained in the densified $CO_2$ formulation, the substrate can be separated from the composition as in cleaning metallic species from substrates, or the metallic species can be chemically reduced in the $CO_2$ composition resulting in coating of the metallic species onto the substrate.

The advantages of the current invention relate to the incorporation of discrete polar microdomains including (but not limited to) aqueous micellular cores into a continuous dense phase $CO_2$ to serve as a faciliatator for aqueous mediated transitions such as ionization and dissociation, and coordination of metal species. The above mentioned disclosures do not describe or intend to describe the use of discrete domains in $CO_2$ to facilitate protic or tranditionally aqueous chemical processes and to mediate coordination of metal atoms and ions. They also do not describe the case where an atomic species is generated in a dispersed bulk aqueous phase, coordinated in the same aqueous phase or interfacially between the dispersed aqueous phase and the continuous $CO_2$ phase, then becoming soluble in the continuous phase. The current invention benefits from chemical dynamics well known to those familiar with aqueous coordination chemistry subverting the limitations previously mentioned regarding non-polar, non-protic solvents including $CO_2$.

Examples of devices that may be cleaned or coated by the present invention include, but are not limited to, microelectromechanical devices (MEMs), optoelectronic devices, integrated circuits, and resist-coated substrates.

Substrates on which the present invention may be carried out include, but are not limited to, silicon wafers (that may include one or more layers thereon such as silicon dioxide, low k dielectric materials, silicon nitride, polysiloxane and/ or metal, etc.) for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

A "discrete polar phase" as used herein refers to separate fluid particles as found in the form of a suspension, dispersion, emulsion, microemulsion, or any other similar form. Discrete phases may be formed in the manner described in U.S. Pat. No. 5,266,205 to Fulton et al., although the discrete phases need not be limited to reverse micellar suspensions as noted above. Polar requires that fluid encompassed in the discrete phase has a material or materials that have a net dipole moment. To be considered applicable to forming a discrete phase if significantly insoluble or shown to form isotropically dispersed clusters in dense $CO_2$ at the processing conditions Suitable examples include but are not limited to surfactant head group that are hydrophilic or lipophilic, organic acids, mineral acids, solvents, etc.

Metals which may be used to carry out the present invention include, but are not limited to, transition metals or d-block metals such as Ni, Pd, Pt, Cu, Ag, and Au, Ta, Ti, Co and also group VI B transition metals including Cr, W, and Mo. Copper (Cu) is particularly preferred.

A "ligand" as used herein refers to an ion, atom, or molecule that acts as an electron pair donor to a metal, otherwise known as a coordination compound, which may be a chelant. Illustrative examples of simple ligands often accompanying an electron balanced metal ion include: alkoxy-ate compounds such as acetate, formate, benzoate, butyrate, β-diketones such as acac, HFAC, trifluoromethyl acac, heptafluoro-3,5-octanedione (HFOD), thionyl trifluoromethyl acac (TTFA), dithiocarbamates such as tetrabutylammonium bis(butyl dithiocarbamate), lithium bis (trifluoroethyl dithiocarbamate) and other fluoroalkyl and fluoroether substituted dithiocarbamates, monodentate and multidentate amines such as pyridine, 2,2-bipyridine, EDTA, phenanthroline, picolylamine, bispicolylamines and derivatives thereof, including fluorine substituted derivatives, monodentate and multidentate thiols, monodentate and multidentate organophosphorous ligands, crown ethers, dithiophosphonic acid derivatives, azo compounds, cyano compounds, carbonyl compounds, cyclopentadiene ligands and derivatives thereof, olefininc ligands such as ethylene, 1,5 bis-cyclooctadiene, aryl and vinyl ligands, cyanide and isocyanide ligands. For the purposes of this invention, alkyl or aryl groups associated with the active coordinating species may be partially or wholly fluorinated to increase the solubility of the coordinating species in carbon dioxide or the resulting complex in dense carbon dioxide.

A "reducing agent" as used herein refers to a molecule, atom, or ion that results in the acceptance of one or more electrons by an atom or ion in an oxidation state greater or equal to (I). Examples of useful reducing agents include but are not limited to: H2, LiBH2Et2, NaAlH2Et2, BH3 and its derivatives, LiAlH4, and NaBH4. Additionally, other transition metal complexes acting as reducing agents in a redox pair, themselves being oxidized, can be used in the invention.

An oxidizing agent or etchant herein refers to a molecule, atom, or ion that participates in a 'redox' reaction by gaining an electron(s) from a reaction with another atom, ion, or molecule. Examples of suitable oxidizing and etching agents include but are not limited to: phosphoric acid, sulfuric acid, hydrochloric acid, HF, nitric acid, acetic acid, chromic acid, trifluoroacetic acid, trifluoromethanesulfonic acid, trifluoromethyl acetic acid, hydrochloric acid, perchloric acid, peroxide, ozone, hypochloride, fluoride, chloride, bromide, acetate, formate as well as other electron accepting ions.

Carbon-dioxide based compositions used to carry out the present invention typically comprise, by weight:

(a) carbon dioxide to balance, typically at least 20, 30, 40, 50, 60, or 95 percent;

(b) from 0, 0.01, 0.1, 0.5, 1 or 2 percent to 5 or 10 percent or more of surfactant to facilitate the formation of micelles or a discrete microdomain in dense carbon dioxide.

(c) from 0, 0.01, 0.1, 1 or 2 to 30, or 40 percent or more of an organic cosolvent solubilized in either or both the carbon dioxide phase or the discrete phase of the microdomain;

(d) from 0.0, 0.1, or 0.5 to 2, 5 or 10 percent, preferably from 0.1 to 2.0 percent by weight of water in a discrete phase; and (e) from 0.001, 0.01 to 1, 2 or 5 percent by weight or more of a ligand;

(f) when present, from $1\times10^{-10}$ to 0.5 percent by weight or more of a metal (higher ranges being preferred when the composition is being used for coating, and lower ranges potentially being found when the composition is being used to carry metals away from a substrate during cleaning);

(g) from 0.0 to 0.001, or 0.01, or 0.1 to 5.0 percent of an oxidizing agent or etchant solubilized in either the carbon dioxide phase or the discrete phase of the microdomain.

(h) from 0.0 to 0.001, or 0.01, or 0.1 to 5.0 percent of an reducing agent provided in the continuous phase or in the microdomain.

The composition may be provided as a liquid or supercritical fluid, including cryogenic liquids. Liquid and supercritical carbon dioxide are herein together referred to as "densified" carbon dioxide in accordance with established usage.

Any surfactant can be used to carry out the present invention, including both surfactants that contain a $CO_2$-philic group (such as described in U.S. Pat. No. 5,783,082 to DeSimone et al.; U.S. Pat. Nos. 5,676,705, 5,683,473 or 5,683,977 to Jureller et al.; U.S. Pat. No. 6,218,353 to Romack et al.; PCT Application WO96/27704) linked to a $CO_2$-phobic group (e.g., a lipophilic group) and surfactants that do not contain a $CO_2$-philic group (i.e., surfactants that comprise a hydrophilic group linked to a hydrophobic (typically lipophilic) group). A single surfactant may be used, or a combination of surfactants may be used. Numerous surfactants are known to those skilled in the art. See, e.g., McCutcheon's Volume 1: Emulsifiers & Detergents (1995 North American Edition) (MC Publishing Co., 175 Rock Road, Glen Rock, N.J. 07452). Examples of the major surfactant types that can be used to carry out the present invention include the: alcohols, alkanolamides, alkanolamines, alkylaryl sulfonates, alkylaryl sulfonic acids, alkylbenzenes, amine acetates, amine oxides, amines, sulfonated amines and amides, betaine derivatives, block polymers, carboxylated alcohol or alkylphenol ethoxylates, carboxylic acids and fatty acids, a diphenyl sulfonate derivatives, ethoxylated alcohols, ethoxylated alkylphenols, ethoxylated amines and/or amides, ethoxylated fatty acids, ethoxylated fatty esters and oils, fatty esters, fluorocarbon-based surfactants, glycerol esters, glycol esters, hetocyclic-type products, imidazolines and imidazoline derivatives, isethionates, lanolin-based derivatives, lecithin and lecithin derivatives, lignin and lignin derivatives, maleic or succinic anhydrides, methyl esters, monoglycerides and derivatives, olefin sulfonates, phosphate esters, phosphorous organic derivatives, polyethylene glycols, polymeric (polysaccharides, acrylic acid, and acrylamide) surfactants, propoxylated and ethoxylated fatty acids alcohols or alkyl phenols, protein-based surfactants, quaternary surfactants, sarcosine derivatives, silicone-based surfactants, soaps, sorbitan derivatives, sucrose and glucose esters and derivatives, sulfates and sulfonates of oils and fatty acids, sulfates and sulfonates ethoxylated alkylphenols, sulfates of alcohols, sulfates of ethoxylated alcohols, sulfates of fatty esters, sulfonates of benzene, cumene, toluene and xylene, sulfonates of condensed naphthalenes, sulfonates of dodecyl and tridecylbenzenes, sulfonates of naphthalene and alkyl naphthalene, sulfonates of petroleum, sulfosuccinamates, sulfosuccinates and derivatives, taurates, thio and mercapto derivatives, tridecyl and dodecyl benzene sulfonic acids, etc.

Examples of $CO_2$-philic groups include fluorine-containing alkyl and aryl groups, siloxane containing groups, and poly(ether-carbonate) copolymers as described in T. Sarbu et al., Nature 405, 165 (11 May 2000).

The current invention provides a process for formation and subsequent processing of coordinated metal ion species in dense phase carbon dioxide by first providing a dense phase carbon dioxide medium, secondly by providing a discrete phase such as an inverse w/c microemulsion whereby bulk water is available for mediation of metal atoms and ion stabilization or formation, and thirdly by providing a coordinating species for said metal atom or ion whereby transport of said coordinated metal species in bulk $CO_2$ dense phase or in the discrete phase, is facilitated.

For most transition metal species, including pure unoxidized metals, oxidized metal species allowed for a given metal, and mixtures of oxidized and neutral metals, the metallic species exist and are stable as clusters in the solid state at ambient pressures and temperatures. Very few pure transition metals demonstrate measurable vapor pressure under standard conditions indicating a lack of individual metal atoms in the gas phase. Since solid state reactions are inefficient, typical reactions including coordination reactions involving transition metal atoms or ions occur in either a gaseous state, a plasma state, or a fluid state where individual atoms or ions can be acted upon. If coordinated metal species are desired for a given use, typically individual metal atoms or ions are stabilized in a gas phase, a liquid phase, or a plasma phase prior to coordination with a given ligand. See "Advance Inorganic Chemistry" 5th addition, Part III, 'The Chemistry of Transition Metal Elements' by Cotton and Wilkinson for details.

Since most transition metal species have boiling points greater than 1000 C., high temperatures at high vacuum must be used to form appreciable quantities of metal atoms in the gas phase. Typically, coordination with ligand species in not favored in this environment as most ligand species decompose prior to coordination because of the thermal excitation of the metal atom. As a result, yields of desired coordinated metal species using gas-phase processes are typically very low and mixed with many decomposition products. Yields can be improved using plasma reactors whereby a vaporized metal atom species can be stabilized to more efficiently coordinate with a given ligand. Typically, in the case of plasma coordination reactions, the individual metal atom species is still created using very high temperatures and low pressures. These coordination reactions can still be relatively inefficient if not ineffective as there can be significant limitations on achieving appreciable quantities of metal atoms in the vapor or plasma phase. Quite commonly, coordinated metal species are created in an aqueous-based highly protic liquid phase generally resulting in formation of metal ions. Once ionization takes place and dissociation of ions in the protic medium occurs to yield individual metal ions in solution, coordination can follow by addition of suitable ligands or chelants. An ideal fluid medium for this to occur is a polar and highly protic medium provided by water. In fact, non polar solvents such as hexane, and dense phase carbon dioxide are poor media for this because they cannot support the formation and dissociation of metal ion species. These solvents possess limited capacity for electron transport, because they are non-polar, $CO_2$ possessing no dipole moment, and non-protic. While polar typically hydrogen-bonding cosolvents such as ethers and alcohols can dissolve certain transition metal species they are often poor mediums for formation and stabilization of metal ions because protic contributions in these environments are typically very low as indicated by the negligible [H+] ion concentration achievable in such solvents.

Formation of a more protic medium in non-polar environments cannot be achieved by mixing water with dense phase $CO_2$ because of the low solubility of water in $CO_2$ (variable by T and P, typically<0.01% by weight). Furthermore, molecularly dissolved water in $CO_2$ provides a medium most similar to bulk $CO_2$ which is already established by itself as a poor solvent for formation and dissociation of metal ions or solubilization of metallic species. What is needed is a fluid medium that can allow for the processing of metallic species, ionization, disassociation, dissolution, reduction, oxidation, electron transport, and coordination while providing the wetting and transport properties of a dense gas fluid such as carbon dioxide. The current invention provides for formation and stabilization of coordinated metal atom species by metal atom ionization and/or dissociation (dissolution) in discrete microdomains which preferably encompass inverse w/c microemulsions followed by coordination with a desired ligand species provided in a $CO_2$ bulk phase or the discrete phase.

The current invention is suitable to be used in conjunction with other carbon dioxide processes whereby coordinated metal atoms and ions need to be provided in a predominantly $CO_2$ bulk phase. Primary examples include the removal of copper containing etch residues from microelectronic substrates such as in the manufacturing of integrated circuits, and the deposition of metal films onto substrates where coordinated metal species are formed in and subsequently deposited in and from dense phase $CO_2$ as coordinated or neutral ions or atoms such as in the application of metallic barrier layers onto semiconductor substrates.

The use of one or more ligands in the processing of metallic species encompassed in this invention is important. First, for a metal ion to be soluble and stable in a liquid it must have a counter ion which is also termed a ligand. The use of one or more ligands as encompassed by this invention enables unique ionic processing in a non-polar supercritical fluid as ligand exchange can take place between the non-polar CO2 continuous phase, and the polar discrete phase also affecting the materials carried in the discrete phase. This exchange can be controlled by the choice of ligands and their preferrential solubility in either phase, along with various adjuncts that facilitate the ion exchange process. Dual solubility of a given ligand in both phases allows for Nanophase-transfer-catalysis (NPT); a process where a ligand species (not necessarily the only ligand species) is soluble in the $CO_2$ continuous phase and in the discrete phase. A mixture comprising; $CO_2$, discrete polar phase, metal ion, NPT ligand. The NPT ligand serves a phase-transfer role in providing/maintaining/atomic shuttling of the equilibrium concentration of metal atom in the continuous phase for the process of transfer of the metal ion from surface-to-discrete phase (cleaning) or discrete phase-to-surface (deposition). Consider that both cleaning and deposition rates for this invention would be limited by the total concentration of metal ion that is entrainable in the continuous phase. The NPT ligand magnifies the transport ability of the continuos phase to move the ion from the surface to the discrete phase or visa versa. The NPT ligand is unique in that it contains three functional groups (1) ionic binding or pi donor capacity of a ligand (2) $CO_2$-philicity (3) polar-phase-philicity. Examples include but are not limited to zwitterionic surfactants, twin-tail surfactants where one of the tails is $CO_2$-philic, the other is polar, polymeric ligands where the polymer backbone is a $CO_2$-philic/polar-philic surfactant, electron pair donors with constituent $CO_2$ philic and discrete phase-philic capacity.

A. Cleaning methods. The cleaning method of the present invention generally comprises the steps of:

(a) providing a substrate having a surface to be cleaned of metal (i.e., from which the metal species or component is to be fully or partially removed)

(b) providing a densified (e.g., liquid or supercritical) carbon dioxide cleaning composition, the composition comprising carbon dioxide as a continuous phase and a discrete phase, as described above containing adjuncts that might include oxidants or etchants, ligands or chelants, or reducing agents;

(c) immersing the surface portion of the substrate in the densified carbon dioxide cleaning composition; and then (d) removing the cleaning composition from the surface portion.

The process parameters may be controlled so that the cleaning composition is maintained as a homogeneous composition during the immersing step, the removing step, or both the immersing and removing step, without substantial deposition or redeposition of the metallic specieson the substrate.

In the case of cleaning semiconductor wafers, such as in the process of manufacturing integrated circuits, there exists a mixture of metal species, considered contaminants, on the surface of the wafer's topographical structure. These metal species consist of residuals from the processing of conductive or barrier layers in the 'stack' of a microelectronic structure such as logic, recording media, read-write heads or memory. The metal species will exist in a mixture of atoms, clusters and particles—each of which will be a mixture of oxidation states. These metallic contaminants will arise on the surface from semiconductor manufacturing processes such as etch, implant and barrier breakthrough—most importantly barrier breakthrough in the dual damascene process, exposing the copper conductor to the next layer of structure in the stack. In this embodiment, the densified CO2 continuous phase can deliver the chemically active agents both in the CO2 as well as in the discrete second phase to the sub-micron structures and topography—without damage or potential deleterious effects of a residual that would be problematic for traditional methods (water or solvent-based cleaning).

The removing step is preferably carried out while maintaining the cleaning composition as a homogeneous multiple phase (or uniformly distributed) composition. As when draining liquid $CO_2$ from a vessel the liquid reaches a state where it is at equilibrium with $CO_2$ vapor, termed saturated vapor pressure. To maintain saturation, as liquid is removed from the vessel by venting or pumping preferably from the bottom of the vessel, the liquid phase boils to generate vapor for the increasing volume of the vapor phase. This boiling which may be nucleated at liquid/gas, and liquid/solid interfaces causes adjuncts with lower vapor pressure than $CO_2$ including, co-solvents and surfactants, and solute contaminants to concentrate at interfaces. Deposited contaminants and interfacial stresses created by boiling at liquid/solid interfaces can be damaging to resist features, MEM's, or other patterned microdevices or deposit unwanted contaminants onto surfaces.

To avoid the above issue when draining a liquid $CO_2$ composition from a pressure vessel, the removing step may be carried out by pressurizing the enclosed chamber in which the process is carried out with a second compressed gas (e.g., helium, nitrogen, air, mixtures thereof) by an amount sufficient to inhibit boiling of the cleaning composition during the draining step. The second gas is preferably one that is substantially immiscible in the cleaning composition possessing a saturated vapor pressure that is higher than $CO_2$. The second gas may be used to itself force the drying composition from the vessel, or the drying composition may be pumped or otherwise drained from the vessel while the second gas maintains an over-pressurization at the gas-liquid interface formed in the wash vessel during draining thereof.

Alternatively, if the cleaning composition is in the liquid phase, the draining step can be accomplished without boiling by liquid-gas equilibration with a secondary chamber or storage vessel. In this scenario, the cleaning chamber is connected to a storage vessel by a gas-side fluid communication line and a liquid-side fluid communication line. Each line contains a valve to separate or isolate the vessels from one another. During the draining step, the storage vessel contains a liquid $CO_2$ composition at a saturated pressure equal to or in excess of the saturated vapor pressure in the cleaning vessel. Draining may be accomplished by first opening the gas-side connection between the vessels, and then opening the liquid-side connection. Liquid flows from the cleaning vessel to the storage vessel by gravity, if the cleaning vessel is located sufficiently above the storage vessel, and/or by pumping. Liquid transfer described above avoids boiling thereby avoiding potential damage to resist features or other device features.

When the cleaning composition is a supercritical cleaning composition there will not be a gas-liquid interface. In this case, the removing step may be carried out by first adding a second material (e.g., a cosolvent as described above or a secondary gas) to the supercritical cleaning composition so that it is converted to a liquid composition or a stratified dual supercritical phase, which can then be removed from the vessel as described above by the continued addition of the secondary gas while venting or draining at constant or near constant pressure. A stratified dual supercritical phase is formed for example by the addition of helium gas to a supercritical $CO_2$ formulation forming a lower phase of higher density, rich in $CO_2$ and poor in He, and a top substantially less dense phase, rich in He and poor in $CO_2$. If a secondary gas is used, the gas should be chosen from those having a saturated vapor pressure that is higher than that of $CO_2$ and/or a critical pressure and temperature higher than that of $CO_2$. Exemplary gases include but are not limited to: nitrogen, argon, helium, oxygen, methane, propane, or butane, and mixtures thereof.

Alternatively, when the cleaning composition is in the supercritical state, the adjunct containing fluid can be sufficiently diluted prior to the draining or venting step by simultaneous addition of pure supercritical $CO_2$ and removal of metal-containing supercritical $CO_2$. After sufficient fluid turnover is accomplished and metal concentration is effectively minimized, the supercritical fluid is vented from the cleaning vessel by maintaining the fluid in the supercritical state until a transition is made directly to the gas state thus avoiding the liquid state. This is accomplished during the draining/venting step by maintaining the fluid temperature above the critical temperature of the mixture (Tc) until the pressure in the vessel is below the critical pressure of the mixture (Pc). Because the expansion of the supercritical fluid and subsequent expansion of the remaining gas is an endothermic process, heat may need to be added to the system to maintain the temperature of the fluid or gas above the critical temperature thus avoiding condensation of the supercritical fluid or gas to a liquid or solid. By effecting a direct transition from the supercritical phase to the gas phase, liquid boiling is avoided thereby avoiding the interfacial stress caused by a retracting liquid meniscus at the liquid/solid interface, and unwanted deposition of solutes onto and in microstructures.

In another embodiment, the removing step is carried out by diluting the cleaning composition with additional carbon dioxide from a supply, during which dilution the cleaning composition is removed from the vessel by a draining system. Since larger quantities of carbon dioxide are required for such a technique, the use of a still to distill drained carbon dioxide, along with appropriate piping and valving for returning the carbon dioxide to a supply source for subsequent re-use, is preferred.

In still another embodiment, a secondary gas is used, at a pressure range above the saturation point of $CO_2$ gas, to displace liquid and gaseous $CO_2$ in the cleaning chamber leaving a predominance of the secondary gas in the vapor phase. The secondary gas, possessing a lower heat of compression, can be vented from the chamber to ambient pressure with less heat loss to the system. Also represented by a smaller Joule-Thomson coefficient, ($\mu$), the expansion of the gas from high pressure to atmospheric conditions results in less change in temperature at or in close proximity to the substrate. ($\mu_{CO_2} > \mu_X$, where X=secondary gas).

$$\mu = (dT/dP)_H$$

In this embodiment, the secondary gas is useful in avoiding thermal shock when rapid cycling of pressure is desired for high throughput. Substrates such as silicon wafers can crack or become damaged when significant temperature gradients exist in that substrate. Cooling of chambers and vessels from gaseous expansion can also add valuable processing time and require substantial heat input for temperature regulation. The use of a secondary gas can minimize heat loss and heat inputs, potentially reducing cycle time and energy requirements.

In another embodiment of the current invention, the use of a secondary gas reduces the redeposition of particulate or transient matter back onto the substrate from vessel walls or chamber components. In this embodiment the secondary gas must have a saturate vapor pressure higher than that of $CO_2$, such as helium, nitrogen, and argon. While draining the stratified dual supercritical phase from the vessel by continuous addition of the secondary gas and simultaneous draining of the lower phase at near constant pressure, the more dense $CO_2$ phase is displaced by the less dense secondary gas phase. Subsequent venting to atmosphere pressure prior to removal of the substrate from the vessel results involves less mass transport from the chamber to the outside vent, meaning less mass force acting on particulate matter and less convective force redistributing particles inside the vessel.

B. Formation of coordinated transition metal species in densified carbon dioxide and subsequent deposition of metallic layers onto substrates. The current invention can be used to form metallic, films on substrates whereby deposition is facilitated by chemical reduction of the coordinated species and takes place in the same $CO_2$ environment in which the metallic species was formed. Without wishing to be bound to any particular theory of the instant invention, such deposition may be carried out as follows:

(i) M (solid)+water+$H^+ \rightarrow M^+$ (aq.) (provided in a w/c microemulsion)

(ii) $M^+$ (aq)+L→M:L (aq. or interfacially) (provided in a w/c microemulsion)

(iii) M:L may or may not partition in part or predominantly to the bulk $CO_2$ phase or in part or predominantly to the aqueous phase (iv) M:L ($CO_2$)+Reducing agent→M (solid)

Where L=ligand=ion, atom, or molecule acting as an electron pair donor; M:L may be neutral or charged.

The methods for deposition of metallic layer onto substrates in the current invention generally encompass the following steps:

(a) providing a substrate having a surface to be metallized (b) dissolution, dispersion or suspension of a metallic species of an oxidation state greater or equal to (I) in densified $CO_2$ containing a discrete microdomain as described above.

(c) Exposure of said substrate to the densified $CO_2$ composition containing said metallic species (d) Addition of a suitable reducing agent to said composition resulting in reduction of the metallic species to a neutral state and deposition onto said substrate.

(e) Removal of said substrate from the densified $CO_2$ composition.

The present invention is explained in greater detail in the following non-limiting Examples.

EXAMPLE 1

Copper ion residue was removed from a patterned semiconductor wafer segment using supercritical $CO_2$ containing a water-in-carbon dioxide microemulsion. Specifically, the semiconductor wafer, the top two layers consisting of a low-k dielectric layer and a patterned photoresist was first exposed to a typical reactive ion etch process. After etching of the dielectric layer, the photoresist was stripped by a plasma using techniques well known to those skilled in the art. Following the plasma ash step, an etch-stop layer located under the dielectric layer was exposed to a reactive ion etch process exposing a copper filled trench to a series of vias patterned in the dielectric layers by the dielectric etch step. The reactive ion-etch process of the etch-stop breakthrough step generated copper containing contaminants (e.g. $CuF_2$, $CuO_2$, $Cu_2O$, etc.) at the bottom of the vias. Additionally, trace amounts of copper (0), copper (I) and copper (II) species were sputtered onto the sidewalls of the vias.

In the cleaning process a wafer segment with the copper containing, reactive ion etch residue was loaded into a high-pressure chamber at 40° C. The chamber was initially pressurized to 1,200 psi with $CO_2$, followed by addition of a $CO_2$-philic surfactant, water plus adjuncts, and additional $CO_2$ to a pressure of 2800 psi. The microemulsion consisted of a phosphate fluorosurfactant, ammonium, bis-(1,1,2,2-tetrahydroperfluoro-n-hexyl) phosphate at 2.5 weight percent with a molar ratio of water to surfactant of 20:1. The water added to the system contained 5% by weight hydrogen peroxide. The chamber containing the wafer segment was maintained at 40 C. and 2800 psi for 10 minutes. The oxidized copper species were dissolved in the aqueous microdomains of the microemulsion. The chamber was flushed with pure $CO_2$ to ensure that all adjuncts and surfactant were removed from the chamber and the chamber was vented. Analysis by SEM and Auger confirmed that no residual copper ion residue remained on the wafer segment after cleaning.

EXAMPLE 2

In this example, copper containing, reactive ion etch residue is removed from semiconductor wafers using a water in supercritical $CO_2$ microemulsion.

Pieces of wafer with the copper containing, reactive ion etch residue were loaded into a high-pressure chamber at 40° C. The chamber was initially pressurized to 1,200 psi. A water in $CO_2$ microemulsion was then formed in the the cleaning chamber. The microemulsion consisted of a perfluoropolyether surfactant (perfluoropolyether ammonium carboxylate, MW=900 g/mol) with 2 weight percent of surfactant and a molar ration of water to surfactant of 20:1. The aqueous domain was preloaded with 5 weight percent of phosphoric acid. The oxidized copper species were dissolved in the aqueous domain of the microemulsion. Aside from stabilizing the aqueous microdomains, the surfactant acted as a complexing agent, coordinating the copper ions and facilitating removal of copper species from the substrate. The wafer was exposed to the microemulsion for 5 minutes, after which the chamber was flushed with $CO_2$ to ensure complete removal of all chemical adjuncts prior to venting. Analysis by SEM and Auger confirmed that no residual copper ion residue remained on the wafer segment after cleaning.

EXAMPLE 3

In this example, copper containing, reactive ion etch residue is removed from semiconductor wafers using a water in supercritical $CO_2$ microemulsion.

Pieces of wafer with the copper containing, reactive ion etch residue were loaded into a high-pressure chamber at 40° C. The chamber was initially pressurized to 1,200 psi. A mixture of HF/pyridine 1% v/v was added to the chamber at 40° C. The wafer was exposed to the HF/pyridine for 15 seconds and was then flushed out of the chamber with pure $CO_2$. All exposed copper species were oxidized to $CuF_2$. A water in $CO_2$ microemulsion was then added to the chamber at 2,800 psi. The microemulsion consisted of a phosphate fluorosurfactant, ammonium, bis-(1,1,2,2-tetrahydroperfluoro-n-hexyl) phosphate, at 2 weight percent of surfactant with a molar ratio of water to surfactant of 20:1. The $CuF_2$ species were solvated by the aqueous microdomain. The wafer was exposed to the microemulsion for 5 minutes. The chamber was flushed with $CO_2$ to ensure that all of the chemical adjunct were removed prior to venting. Analysis by SEM and Auger confirmed that no residual copper ion residue remained on the wafer segment after cleaning.

EXAMPLE 4

In this example, a copper film is deposited from a densified carbon dioxide fluid onto a ceramic substrate by reduction of a copper ion species stabilized in a discrete phase.

To a chamber containing a target substrate, a 2:1 molar excess of a carboxylic acid terminated perfluropolyether (~MW 1100) was added directly to an amount of Cu(II) acetate in a pressure vessel at 90° C. with $CO_2$ gas at a pressure of 500 psi. After a period of 5 minutes, additional $CO_2$ was added to a pressure of 4200 psi at 90° C. forming a stable supercritical $CO_2$ continuous phase and a discrete phase of aggregated perfluorpolyether carboxylate surfactant molecules also coordinated as ligands with Cu(II) ions in the discrete phase. A 10-fold molar excess of hydrogen gas to Cu(II) was then added to the carbon dioxide formulation after which the vessel was maintained at constant temperature for an additional 5 minutes. The chamber was then rinsed at constant pressure for three fluid turnovers and the chamber vented to ambient conditions. The ceramic substrate was removed showing a consistent metallic surface.

EXAMPLE 5

In this example, a copper film is deposited from a densified carbon dioxide fluid onto a ceramic substrate by reduction of a copper ion species stabilized in a carbon dioxide-based fluid containing a discrete polar phase represented by a water-in-$CO_2$ microemulsion.

The ceramic substrate was added to a pressure vessel containing an internal heating element that heat the substrate to 110° C. while maintaining the vessel temperature consistently at 70° C. The vessel was sealed and $CO_2$ was added to 4000 psi and the temperature of the vessel was maintained at 70° C.

A water-in-$CO_2$ microemulsion was formed by the slow addition of an aqueous Cu(II) ion formulation to the supercritical carbon dioxide formulation that also contained 2.0% by weight of sodium, bis-(1,1,2,2-tetrahydroperfluoro-n-hexyl) phosphate surfactant and 3% of a hydrofluoroether cosolvent and 1% methanol. The addition of the aqueous formulation took place at 70C. and 4000 psi. Prior to addition, the Cu ion solution was formed by addition of Cu(II) chloride to deionized water at 70 C. creating a 10% by weight solution. A molecular ratio of 15:1 water to surfactant was achieved after the aqueous addition was complete.

After a brief equilibration period, a $CO_2$ soluble cheating agent was added to the $CO_2$ composition. Hexafluoroacetoacetonate was added to the pressure vessel to 1% concentration by weight. A 10-fold molar excess of hydrogen gas was then added to the vessel, which was allowed to equilibrate at constant temperature for 10 minutes. The chamber was then flushed with pure $CO_2$ and vented to atmospheric conditions. The substrate was removed showing that a consistent metallic layer had been deposited onto the surface of the ceramic material.

EXAMPLE 6

In this example, a cobalt alloy film is deposited from a densified carbon dioxide fluid onto a microelectronic substrate by reduction of metal ion species stabilized in a carbon dioxide-based fluid containing a discrete phase represented by a water-in-$CO_2$ microemulsion. The microelectronic substrate contains a low k dielectric layer on top of a copper metal layer. Portions of the top dielectric layer were opened to the copper layer by a patterning process followed by a low k dielectric etch step, followed by an etch stop breakthrough step. After cleaning to remove etch residues and transient patterning materials, the substrate was prepared for deposition of a metallic barrier layer directly to the exposed copper surface.

A water-in-$CO_2$ microemulsion was formed by the slow addition of an aqueous cobalt and tungsten ion formulation to a supercritical carbon dioxide formulation containing 2.0% by weight of sodium, bis-(1,1,2,2-tetrahydroperfluoron-hexyl) phosphate surfactant. The aqueous formulation was formed by the addition of 3 part Co(II) chloride, 3 part sodium citrate dihydrate, and 1 part tungstic acid sodium dihydrate, 0.5 parts trihydroxyethyl amine, and 2 parts methanol to 20 parts water.

The aqueous metal ion formulation was added to supercritical $CO_2$ at 70° C. and 3500 psi forming a microemulsion with a molecular ratio of 10:1 water to surfactant.

Once equilibrated, the carbon dioxide formulation containing the discrete phase carrying the metallic ions was added to a chamber containing the substrate and supercritical $CO_2$. The addition was carried out to avoid any substantial change in pressure or temperature. Dimethyl amine borane complex was added to the vessel at a ratio of 1 part borate to 2 parts cobalt species. After a period of 20 minutes, the supercritical fluid composition was rinse from the chamber with pure $CO_2$ and the vessel was vented to atmospheric conditions. Detailed analytical experimentation confirmed the presence of a cobalt alloy deposited onto the copper surface.

The foregoing is illustrative of the present invention, and is not to be construed as limiting thereof. The invention is defined by the following claims, with equivalents of the claims to be included therein.

That which is claimed is:

1. A method of cleaning metal from a substrate, comprising the steps of:
   (a) providing a substrate having a surface portion to be cleaned of metal;
   (b) providing a densified carbon dioxide cleaning composition, the composition comprising carbon dioxide as a continuous phase, a discrete polar phase, and at least one ligand solubilized in said discrete phase, said continuous phase or both said discrete phase and said continuous phase;
   (c) immersing the surface portion in said densified carbon dioxide cleaning composition so that said metal associates with said ligand; and then
   (d) removing the cleaning composition from the surface portion so that said metal is thereby cleaned from said surface portion.

2. A method according to claim 1, wherein said step of providing a substrate having a surface portion to be cleaned is carried out by: (i) providing a semiconductor substrate having a barrier formed thereon, and (ii) etching through said barrier to thereby produce a semiconductor to be cleaned.

3. A method according to claim 1, wherein said step of providing a substrate having a surface portion to be cleaned is carried out by: (i) providing a semiconductor substrate having a surface portion to be planarized, and then (ii) planarizing said surface portion by chemical mechanical planarization to thereby provide a semiconductor to be cleaned.

4. A method according to claim 1, wherein said step of providing a substrate having a surface portion to be cleaned is carried out by: (i) providing a low k dielectric semiconductor substrate to be etched, and (ii) etching said semiconductor to thereby provide a semiconductor to be cleaned.

5. A method according to claim 1, wherein said metal is selected from the group consisting of Ni, Pd, Pt, Cu, Ta, Ti, Cr, W, Co, Ag, and Au.

6. A method according to claim 1, wherein said ligand is soluble in said carbon dioxide continuous phase.

7. A method according to claim 1, wherein said ligand is soluble in said discrete phase.

8. A method according to claim 1, wherein said ligand is selected from the group consisting of chlorate, perchlorate, chloride, fluoride, fluorosilicate, hydroxide, oxide silicide, silicate, bromide, iodide, sulfide, sulfate, nitrate, nitride, phosphate, phosphite, phosphide, oxychloride, oxyfluoride, carbide, perchlorate, and oxyfluoride ligands.

9. A method according to claim 1, wherein said ligand is selected from the group consisting of acetate, acetoacetonate, benzoate, metaborate, bromate, butyrate, dichromate, formate, laurate, salicylate, citrate, tartrate, lactate, maleate, thiol, dithiol, amine, and diamine, pyridine, bipyridine, crown ether, azo, phosphine, cyano, dithiophosphanic acid, organophosphorous, dithiocarbamate, and beta-diketone ligands.

10. A method according to claim 1, wherein said carbon dioxide is liquid carbon dioxide.

11. A method according to claim 1, wherein said carbon dioxide is supercritical carbon dioxide.

12. A method according to claim 1, wherein said composition further comprises a surfactant.

13. A method according to claim 1, wherein said ligand is a surfactant.

14. A method according to claim 1, wherein said composition is a suspension, dispersion, emulsion or microemulsion.

15. A method according to claim 1, wherein said discrete phase comprises an aqueous discrete phase.

16. A method according to claim 1, wherein said substrate is a semiconductor substrate.

17. A method according to claim 1, wherein said substrate is a photolithographic imaging lens or a mask.

18. A method according to claim 1, wherein said metal comprises particles.

19. A method according to claim 1, wherein said metal is an etch residue.

20. A method according to claim 1, wherein said metal comprises copper in an oxidation state of (0), (I), or (II).

21. A method according to claim 1, wherein at least one of said at least one ligand is preferentially soluble in said continuous phase.

22. A method according to claim 1, wherein at least one of said at least one ligand is preferentially soluble in said discrete phase.

23. A method according to claim 1, wherein said discrete polar phase comprises a surfactant.

24. A method according to claim 23, wherein said surfactant coordinates with said metal.

25. A method of coating a metal onto a substrate, comprising the steps of:
   (a) providing a substrate having a surface portion to be coated with a metal;
   (b) providing a densified carbon dioxide composition, said composition comprising carbon dioxide as a continuous phase, a polar discrete phase, a metallic species and at least one ligand dissolved in said discrete phase, said continuous phase, or both said discrete phase and said continuous phase;

(c) immersing the surface portion in said carbon dioxide composition;

(d) adding a reducing agent to said carbon dioxide composition so that said metallic species is chemically reduced, separates from said ligand and deposits on said surface portion; and then (e) removing said carbon dioxide composition from the surface portion to leave metal deposited on said surface portion.

26. A method according to claim 25, wherein said surface portion is metallic.

27. A method according to claim 25, wherein said surface portion comprises a silicon dioxide surface portion.

28. A method according to claim 25, wherein said silicon dioxide surface portion is porous.

29. A method according to claim 25, wherein said silicon dioxide surface portion includes pores having pore sizes of between 2 and 100 nm.

30. A method according to claim 25, wherein said surface portion comprises both a metallic portion and a silicon dioxide-based surface portion.

31. A method according to claim 30, of where said reduced metal species is preferentially deposited onto said metallic surface.

32. A method according to claim 25, wherein said substrate comprises a semiconductor.

33. A method according to claim 32, wherein said metal deposited on said surface portion serves as a seed layer for subsequent substrate metallization.

34. A method according to claim 32, wherein said metal deposited on said surface portion serves as a barrier layer preventing atomic migration of species into or through low k dielectric layers contained in said semiconductor-based substrate.

35. A method according to claim 25, wherein said metal is selected from the group consisting of Ni, Pd, Pt, Cu, Ta, Ti, Cr, W, Co, Ag, and Au.

36. A method according to claim 25, wherein said ligand is soluble in said carbon dioxide continuous phase.

37. A method according to claim 25, wherein said ligand is soluble in said discrete phase.

38. A method according to claim 25, wherein said ligand is selected from the group consisting of acetate, acetoacetonate, benzoate, metaborate, bromate, butyrate, dichromate, formate, laurate, salicylate, citrate, tartrate, lactate, maleate, thiol, dithiol, amine, and diamine, pyridine, bipyridine, crown ether, azo, phosphine, cyano, dithiophosphanic acid, organophosphorous, dithiocarbamate, and beta-diketone ligands.

39. A method according to claim 25, wherein said carbon dioxide is liquid carbon dioxide.

40. A method according to claim 25, wherein said carbon dioxide is supercritical carbon dioxide.

41. A method according to claim 25, wherein said composition further comprises a surfactant.

42. A method according to claim 25, wherein said ligand is a surfactant.

43. A method according to claim 25, wherein said composition is a suspension, dispersion, emulsion or microemulsion.

44. A method according to claim 25, said discrete phase is an aqueous discrete phase.

45. A method according to claim 25, wherein said deposited metal comprises a uniform consistent film.

46. A method according to 25, wherein said deposited metal comprises a particulate.

47. A method according to 46, wherein said particulate is between 5 and 100 nm in size.

48. A method of coating a metal onto a substrate comprising the steps of:

(a) providing a substrate having a surface portion to be coated with a metal;

(b) providing a densified carbon dioxide composition, said composition comprising carbon dioxide as a continuous phase, a polar discrete phase, a metallic species and at least one ligand dissolved in said discrete phase, said continuous phase, or both said discrete phase and said continuous phase;

wherein said ligand is selected from the group consisting of chlorate, perchlorate, chloride, fluoride, fluorosilicate, hydroxide, oxide silicide, silicate, bromide, iodide, sulfide, sulfate, nitrate, nitride, phosphate, phosphite, phosphide, oxychloride, oxyfluoride, carbide, perchlorate, and oxyfluoride ligands;

(c) immersing the surface portion in said carbon dioxide composition;

(d) adding a reducing agent to said carbon dioxide composition so that said metallic species is chemically reduced, separates from said ligand and deposits on said surface portion; and then (e) removing said carbon dioxide composition from the surface portion to leave metal deposited on said surface portion.

* * * * *